US008940101B2

(12) United States Patent
Jeong et al.

(10) Patent No.: US 8,940,101 B2
(45) Date of Patent: Jan. 27, 2015

(54) APPARATUS FOR CLEANING SUBSTRATE

(75) Inventors: Beung-Hwa Jeong, Yongin (KR);
Kwang-Nam Kim, Yongin (KR);
Gyoo-Chul Jo, Yongin (KR)

(73) Assignee: Samsung Display Co., Ltd.,
Gyeonggi-do (KR)

( * ) Notice: Subject to any disclaimer, the term of this patent is extended or adjusted under 35 U.S.C. 154(b) by 322 days.

(21) Appl. No.: 13/243,954

(22) Filed: Sep. 23, 2011

(65) Prior Publication Data
US 2012/0318306 A1 Dec. 20, 2012

(30) Foreign Application Priority Data
Jun. 14, 2011 (KR) ........................ 10-2011-0057605

(51) Int. Cl.
*B08B 1/02* (2006.01)
*B08B 3/02* (2006.01)
*B08B 3/08* (2006.01)
*B08B 7/04* (2006.01)
*H01L 21/67* (2006.01)
*H01L 21/677* (2006.01)

(52) U.S. Cl.
CPC ... *B08B 3/02* (2013.01); *B08B 3/08* (2013.01); *B08B 7/04* (2013.01); *H01L 21/67028* (2013.01); *H01L 21/67051* (2013.01); *H01L 21/67173* (2013.01); *H01L 21/67178* (2013.01); *H01L 21/6776* (2013.01)

USPC ................... 134/32; 134/4; 134/25.4; 134/26

(58) Field of Classification Search
None
See application file for complete search history.

(56) References Cited

U.S. PATENT DOCUMENTS

| 4,560,417 A | * | 12/1985 | Bardina et al. | 134/1 |
| 2007/0151950 A1 | | 7/2007 | Kim | |
| 2009/0101186 A1 | * | 4/2009 | Hiroshiro et al. | 134/56 R |
| 2009/0133837 A1 | * | 5/2009 | Lee et al. | 156/345.31 |
| 2009/0288680 A1 | * | 11/2009 | Kaneko et al. | 134/4 |

FOREIGN PATENT DOCUMENTS

| KR | 10-2006-0058989 A | 6/2006 |
| KR | 10-2007-0070948 A | 7/2007 |
| KR | 10-2007-0097888 A | 10/2007 |
| KR | 10-2008-0046375 A | 5/2008 |
| KR | 10-2008-0103410 A | 11/2008 |

* cited by examiner

Primary Examiner — Eric Golightly
(74) Attorney, Agent, or Firm — Knobbe, Martens, Olson & Bear, LLP

(57) ABSTRACT

An apparatus for cleaning a substrate is disclosed. The apparatus includes a first chamber through which a substrate is conveyed, a second chamber where an oxide film formed on the substrate conveyed from the first chamber is removed; and a third chamber that discharges the substrate conveyed from the second chamber to the outside after rinsing the substrate, wherein the first chamber and the third chamber are disposed on top and on bottom.

23 Claims, 3 Drawing Sheets

APPARATUS FOR CLEANING SUBSTRATE

CROSS-REFERENCE TO RELATED PATENT APPLICATION

This application claims priority to and the benefit of Korean Patent Application No. 10-2011-0057605, filed on Jun. 14, 2011, in the Korean Intellectual Property Office, the entire content of which is incorporated herein in its entirety by reference.

BACKGROUND

1. Field

The described technology generally relates to an apparatus for cleaning a substrate.

2. Description of the Related Technology

Flat panel displays such as organic light-emitting displays and liquid crystal displays are formed on substrates having a pattern which includes at least one thin-film transistor (TFT), a capacitor, and a wire that connects the TFT and the capacitor.

The TFT may typically be formed on amorphous silicon or polysilicon. In particular, because polysilicon has a field effect mobility that is higher than that of amorphous silicon, a TFT formed using polysilicon may be used as a driving device. When a flat panel display is formed using polysilicon, a driving circuit may also be formed on a substrate by configuring a driving device in an array substrate. Therefore, it is unnecessary to attach an additional printed circuit board (PCB) having a driving circuit to the flat panel display.

SUMMARY

One inventive aspect is an apparatus for cleaning a substrate. The apparatus prevents the occurrence of a stain on the substrate in removing a silicon oxide film formed on the substrate, and thus, reduces production costs Another aspect is an apparatus for cleaning a substrate, the apparatus including: a first chamber through a substrate is conveyed; a second chamber where an oxide film formed on the substrate conveyed from the first chamber is removed; and a third chamber that discharges the substrate conveyed from the second chamber to the outside after rinsing the substrate, wherein the first chamber and the third chamber are disposed on top and on bottom.

The first chamber may be located on the third chamber.

The first chamber may be located below the third chamber.

The first chamber and the third chamber may be disposed on top and on bottom on a side of the second chamber.

The first chamber may include an ionizer that removes static electricity from the substrate.

The first chamber may include a conveying member that conveys the substrate to the second chamber.

The oxide film may be removed from the substrate in the second chamber by sequentially spraying first de-ionized water and a fluorine aqueous solution on the substrate.

In the second chamber, first de-ionized water may be sprayed before spraying the fluorine aqueous solution on the substrate, and second de-ionized water may be sprayed after spraying the fluorine aqueous solution on the substrate.

After spraying the second de-ionized water, ozonated water and third de-ionized water may be sequentially sprayed on the substrate.

The second chamber may include: an inlet through which the substrate conveyed from the first chamber enters into the second chamber; an outlet through which the substrate enters into the third chamber from the second chamber; an up-and-down moving member that moves the substrate up and down in the second chamber; and a spray member that sprays liquid cleaning agents on the substrate to remove the oxide film and to wash the substrate.

The apparatus for cleaning a substrate may further include an ionizer disposed adjacent to the entering slot in the first chamber.

The ionizer may remove static electricity from the substrate before the substrate enters into the second chamber.

When the first chamber is disposed on the third chamber, the up-and-down moving member may move the substrate that enters from the first chamber towards a lower direction in the second chamber, and when the first chamber is disposed below the third chamber, the up-and-down moving member may move the substrate that enters from the first chamber towards an upper direction in the second chamber.

The apparatus for cleaning a substrate may further include rear-side spray nozzles that are disposed below the up-and-down moving member to wash the substrate when the substrate is conveyed from the second chamber to the third chamber.

The rear-side spray nozzles may wash the substrate by spraying de-ionized water on a lower surface of the substrate.

The spray member may spray liquid cleaning agents by moving above the substrate.

The liquid cleaning agents may include first de-ionized water, fluorine aqueous solution, second de-ionized water, and ozonated water.

The spray member may include a first nozzle that sprays the first de-ionized water and the fluorine aqueous solution and a second nozzle that sprays the second de-ionized water and the ozonated water.

When the spray member sprays a liquid cleaning agent, the up-and-down moving member may tilt the substrate to a predetermined angle with respect to the horizon.

The liquid cleaning agent may be first de-ionized water, fluorine aqueous solution, second de-ionized water, or ozonated water, and the spray member may include a single common nozzle to spray the liquid cleaning agent.

The apparatus for cleaning a substrate may further include a fourth chamber that is located between the second chamber and the third chamber and rinses the substrate.

The fourth chamber may include a first rinse zone where the substrate that emerges from the second chamber is rinsed by spraying de-ionized water, and a second rinse zone where the substrate that emerges from the first rinse zone is rinsed by spraying de-ionized water.

The third chamber may include an air-knife that blows a gas on the substrate.

DETAILED DESCRIPTION

Figure 1:
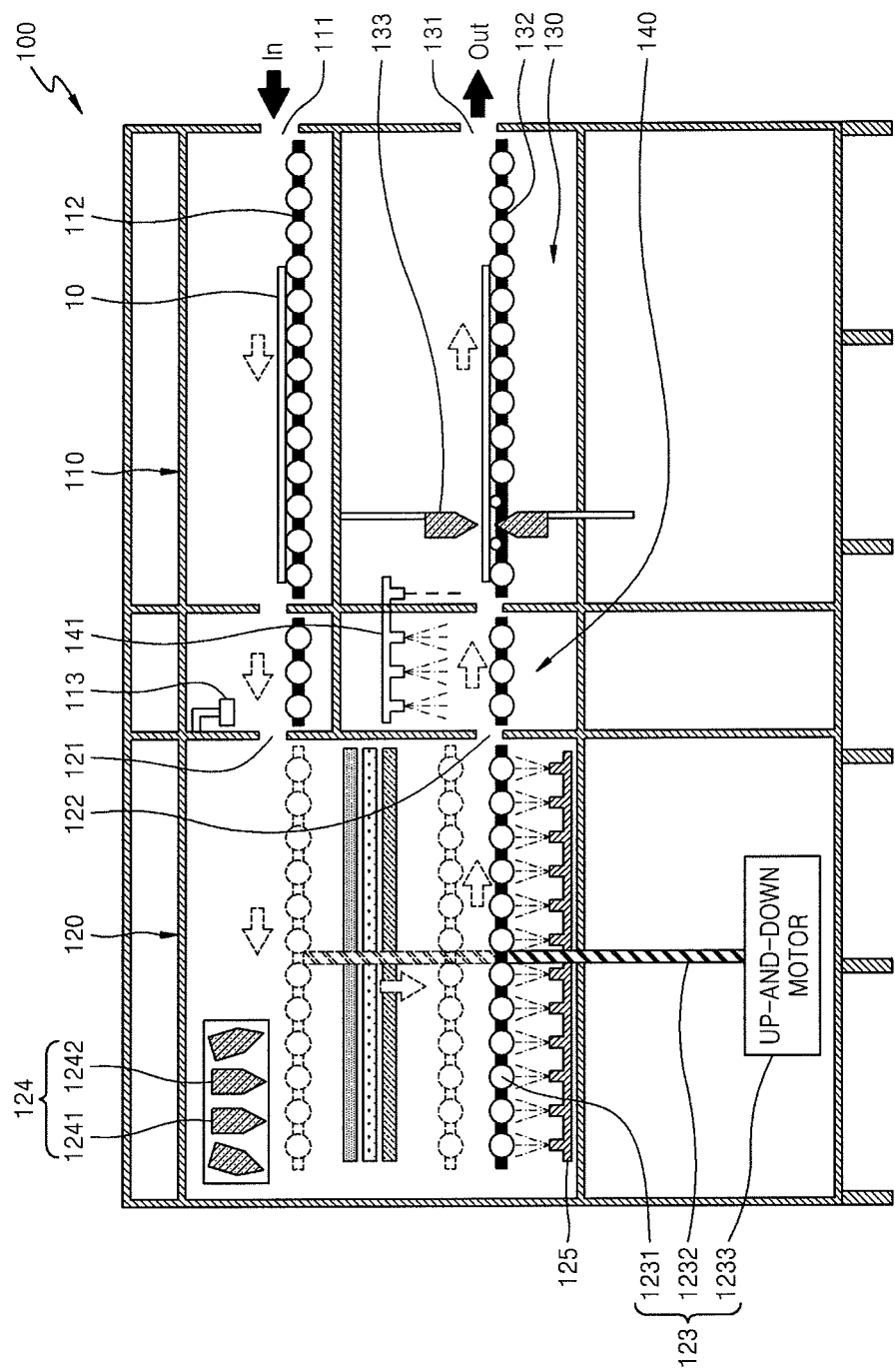
FIG. 1 is a schematic lateral cross-sectional view of an apparatus for cleaning a substrate according to an embodiment.

Embodiments will now be described more fully with reference to the accompanying drawings. In the drawings, the thicknesses of layers and regions may be exaggerated for clarity, and like reference numerals refer to like elements.

FIG. 1 is a schematic lateral cross-sectional view of an apparatus for cleaning a substrate according to an embodiment.

Referring to FIG. 1, a cleaning system 100 may include a first chamber 110, a second chamber 120, a third chamber 130, and a fourth chamber 140.

The first chamber 110 conveys a substrate 10 introduced to the first chamber 110 to the second chamber 120. The first chamber 110 may include an inlet 111 through which the substrate 10 is introduced, a conveying member 112 that conveys the substrate 10, and an ionizer 113. The conveying member 112 may be a track type conveying member. The ionizer 113 may remove static electricity on the substrate 10. The ionizer 113 may be disposed adjacent to an inlet 121 of the second chamber 120 in the first chamber 110. That is, the ionizer 113 may remove static electricity on the substrate 10 before the substrate 10 is conveyed to the second chamber 120. The inlet 121 is formed between the first chamber 110 and the second chamber 120. The substrate 10 is conveyed to the second chamber 120 through the inlet 121.

The first chamber 110 may be located above the third chamber 130 on a side of the second chamber 120. As depicted in FIG. 1, the first chamber 110 may be located on a right side of the second chamber 120, and the third chamber 130 may be located below the first chamber 110. As a modified example, the first chamber 110 may be located below the third chamber 130, as described below.

An oxide film formed on the substrate 10 may be removed in the second chamber 120. Before the substrate 10 is introduced into the apparatus (for cleaning a substrate) depicted in FIG. 1, an amorphous silicon layer (not shown) is formed on the substrate 10. The substrate 10 on which the amorphous silicon layer is formed may pass through a series of processes, and then, a thin-film transistor (TFT) may be formed on the substrate 10. Amorphous silicon in its nature forms a silicon oxide film when the amorphous silicon is exposed to air or the environment, and the silicon oxide film formed in the air is contaminated with foreign materials due to impurities in the air. When an amorphous silicon layer having the naturally formed and contaminated silicon oxide film (hereinafter, referred to as a natural-silicon oxide film) is crystallized by irradiating a laser, defects may occur in grains during a crystallization process due to the impurities, which results in a reduction of carrier mobility, and thus, reducing the stability of a device. Therefore, a process for removing the natural-silicon oxide film needs to be performed before the crystallizing process. The natural-silicon oxide film on the substrate 10 is removed in the second chamber 120.

The second chamber 120 may include the inlet 121, an outlet 122, an up-and-down moving member 123, and a spray member 124.

The substrate 10 introduced in the first chamber 110 is conveyed to the second chamber 120 through the inlet 121. The substrate 10 is conveyed to the third chamber 130 from the second chamber 120 through the outlet 122.

The up-and-down moving member 123 conveys the substrate 10 conveyed from the first chamber 110 within the second chamber 120. Referring to FIG. 1, when the substrate 10 is conveyed from the first chamber 110 to the second chamber 120, the up-and-down moving member 123 is positioned close to the inlet 121. When the substrate 10 is placed on the up-and-down moving member 123 after entering the second chamber 120 through the inlet 121, the up-and-down moving member 123 is lowered down to the spray member 124. Afterwards, when a washing process for washing the substrate 10 is completed and the substrate 10 is conveyed to the third chamber 130, the up-and-down moving member 123 returns to the position close to the inlet 121.

The up-and-down moving member 123 may include a track 1231, a shaft 1232, and an up-and-down driving motor 1233. The track 1231 supports the substrate 10. The shaft 1232 connects the track 1231 to the up-and-down driving motor 1233 to move the track 1231 up and down within the second chamber 120 via the up-and-down driving motor 1233. The up-and-down driving motor 1233 generates a driving force to move the track 1231 up and down.

The spray member 124 sprays liquid cleaning agents to remove and wash an oxide film (not shown) formed on the substrate 10. The spray member 124 may spray the liquid cleaning agents while moving above the substrate 10. Accordingly, the liquid cleaning agents may be substantially uniformly sprayed on the entire surface of the substrate 10. Therefore, the occurrence of stains that may be caused due to partial removal of the oxide film may be prevented.

The liquid cleaning agents may be first de-ionized water, fluorine aqueous solution, second de-ionized water, or ozonated water. The spray member 124 may include a first nozzle 1241 that sprays the first de-ionized water and the fluorine aqueous solution and a second nozzle 1242 that sprays the second de-ionized water and the ozonated water. The spray member 124 may also include four nozzles that respectively spray the first de-ionized water, the fluorine aqueous solution, the second de-ionized water, and the ozonated water.

The first nozzle 1241 rinses the substrate 10 by spraying the first de-ionized water on the substrate 10. Afterwards, the first nozzle 1241 removes an oxide film from the substrate 10 by spraying the fluorine aqueous solution on the substrate 10. As described above, in order to form a TFT on the substrate 10, a pure amorphous silicon layer is formed on the substrate 10, and the pure amorphous silicon layer is crystallized by irradiating a laser beam, thereby forming a polysilicon layer. The substrate 10 may be exposed to the environment before the crystallization process is performed, and accordingly, a natural-silicon oxide film may be formed on the pure amorphous silicon layer as a result of a reaction between the pure amorphous silicon layer and oxygen in the air. In this case, impurities in the air (in particular, metallic impurities) may be involved in the reaction between the pure amorphous silicon layer and oxygen in the air, and as a result, the natural-silicon oxide film formed on the pure amorphous silicon layer is in an contaminated state due to the impurities. The contaminated natural-silicon oxide film may be removed by the fluorine aqueous solution.

As described above, the first nozzle 1241 sprays the first de-ionized water and the fluorine aqueous solution. The first nozzle 1241 sprays the first de-ionized water for a predetermined period of time, and before the spray of the first de-ionized water is completed, the fluorine aqueous solution is sprayed. That is, for a predetermined period of time before the spray of the first de-ionized water is completed, the first de-ionized water and the fluorine aqueous solution are substantially simultaneously sprayed on the substrate 10. If the fluorine aqueous solution is sprayed after the spray of the first de-ionized water is completed, the oxide film may be non-uniformly removed due to rapid change of the concentration of the fluorine aqueous solution, and thus, may cause a stain. However, in the current embodiment, the occurrence of the stains may be prevented by substantially simultaneously praying the first de-ionized water and the fluorine aqueous solution for a predetermined period of time.

The second nozzle 1242 may sequentially spray the second de-ionized water and the ozonated water. The second nozzle 1242 may spray the second de-ionized water before the spray of the fluorine aqueous solution by the first nozzle 1241 is completed. That is, the fluorine aqueous solution and the second de-ionized water may be substantially simultaneously sprayed on the substrate 10 for a predetermined period of time before the spray of the fluorine aqueous solution is completed. Also, the second nozzle 1242 may spray the ozonated water on the substrate 10 before the spray of the second de-ionized water is completed.

The second de-ionized water may wash away the fluorine aqueous solution remaining on the substrate 10. The ozonated water may form a silicon oxide film by reacting with the pure amorphous silicon layer exposed by the removal of the natural-silicon oxide film.

The ozonated water generally has a high purity and does not include any impurities. Accordingly, the silicon oxide film formed by reacting with the ozonated water is a pure silicon oxide film that does not include any impurities. Because the silicon oxide film is formed on the pure amorphous silicon layer, even though the substrate 10 is exposed to the environment, the formation of the natural-silicon oxide film having an impurity may be prevented. The pure silicon oxide film formed by reacting with the ozonated water has a hydrophilic characteristic unlike the pure amorphous silicon layer that has a hydrophobic characteristic. Because the pure silicon oxide film is formed on the substrate 10, even though the substrate 10 is exposed to the environment, the natural-silicon oxide film that includes impurities may not further be formed.

The second chamber 120 may further include rear-side spray nozzles 125. The rear-side spray nozzles 125 may be disposed below the track 1231, and may spray de-ionized water onto a lower surface of the substrate 10.

The substrate 10 that emerges from the second chamber 120 is conveyed to the outside of the apparatus for cleaning a substrate through the third and fourth chambers 130 and 140. The fourth chamber 140 is located between the second and third chambers 120 and 130. The fourth chamber 140 rinses the substrate 10 by spraying de-ionized water on the substrate 10. The fourth chamber 140 may include nozzles for spraying de-ionized water.

The third chamber 130 may include an air-knife 133 that blows a gas on the substrate 10 that emerges from the fourth chamber 140 and a track 132 that conveys the substrate 10. The air-knife 133 removes liquid remaining on the substrate 10 by blowing a gas such as nitrogen $N_2$. The substrate 10 is conveyed along the track 132 in the third chamber 130, and liquid remaining on the substrate 10 is removed by the air-knife 133. The substrate 10 is discharged to the outside through an outlet 131 of the third chamber 130.

Referring to FIG. 1, the fourth chamber 140 and the third chamber 130 may be located below the first chamber 110. That is, the three chambers 110, 130 and 140 may configure a bi-layer structure.

In a typical apparatus for cleaning a substrate, in which a plurality of chambers are arranged in a row, each chamber is configured as a closed system, thereby increasing costs for manufacturing an apparatus for cleaning a substrate. In particular, in the case of a large substrate having a size of about 5 G (1100×1300 mm) or greater, an area occupied by the apparatus for cleaning a substrate is increased, thereby further increasing facility investment costs. However, in the apparatus for cleaning a substrate, according to the current embodiment, as described above, chambers are configured in a bi-layer structure, and thus, the total size of the apparatus for cleaning a substrate is reduced, and the first chamber 110, the second chamber 120, and the third and fourth chambers 130 and 140 are configured as two to three closed systems, thereby reducing facility investment costs.

Figure 2:
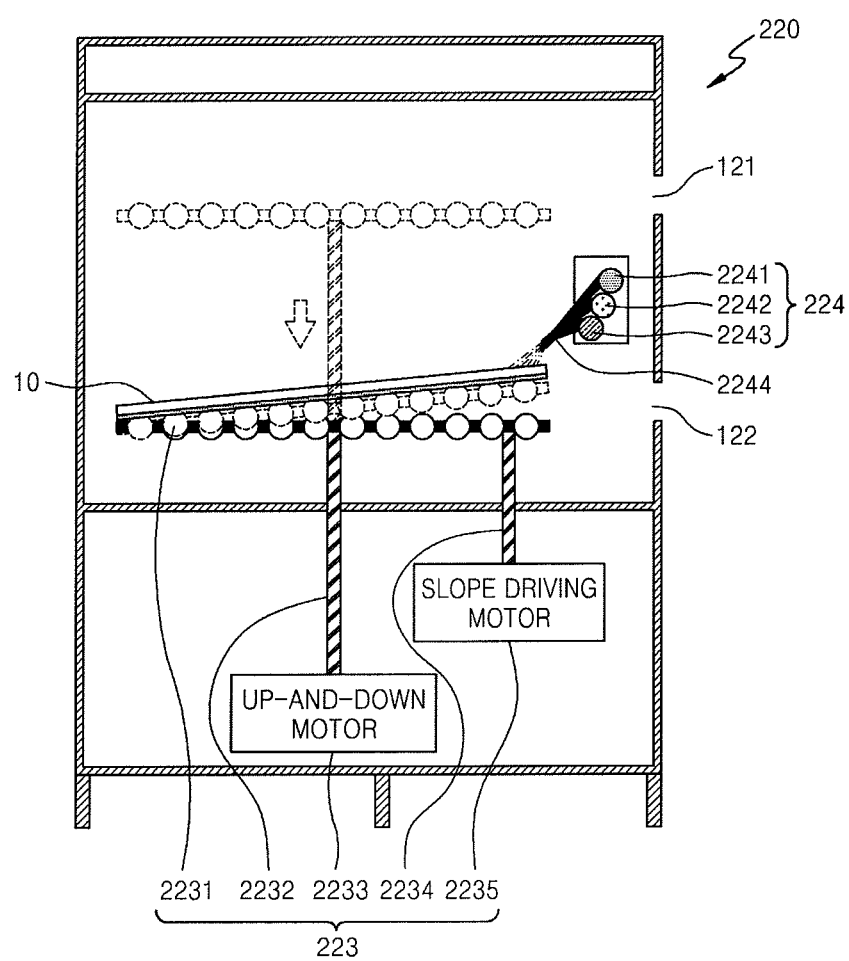
FIG. 2 is a schematic lateral cross-sectional view of a modified example of a second chamber.

FIG. 2 is a schematic lateral cross-sectional view of a modified example of a second chamber 220.

Referring to FIG. 2, the second chamber 220 may include an up-and-down moving member 233 and a spray member 224.

The up-and-down moving member 233 may include a track 2231, a first shaft 2232, an up-and-down driving motor 2233, a second shaft 2234, and a slope driving motor 2235. The track 2231 may support the substrate 10. The first shaft 2232 connects the track 2231 to the up-and-down driving motor 2233 to move the track 2231 within the second chamber 220 via the up-and-down driving motor 2233. The up-and-down driving motor 2233 generates a driving force to move the track 2231 up and down.

The second shaft 2234 connects the track 2231 to the slope driving motor 2235. The second shaft 2234 is connected to a side of the track 2231 to slant the track 2231 at a predetermined angle via the slope driving motor 2235. Due to the slant of the track 2231, liquid cleaning agents sprayed from the spray member 224 can be substantially uniformly spread on the substrate 10.

The spray member 224 may spray liquid cleaning agents that can remove an oxide film from the substrate 10 and wash the substrate 10. The spray member 224 may include a de-ionized water nozzle 2241, an ozonated water nozzle 2242, and a fluorine aqueous solution nozzle 2243. The de-ionized water nozzle 2241, the ozonated water nozzle 2242, and the fluorine aqueous solution nozzle 2243 may have a common discharge hole 2244. That is, de-ionized water, ozonated water, and fluorine aqueous solution are respectively supplied by the de-ionized water nozzle 2241, the ozonated water nozzle 2242, and the fluorine aqueous solution nozzle 2243; however, when they are sprayed on the substrate 10, they exit from one common discharge hole 2244.

Figure 3:
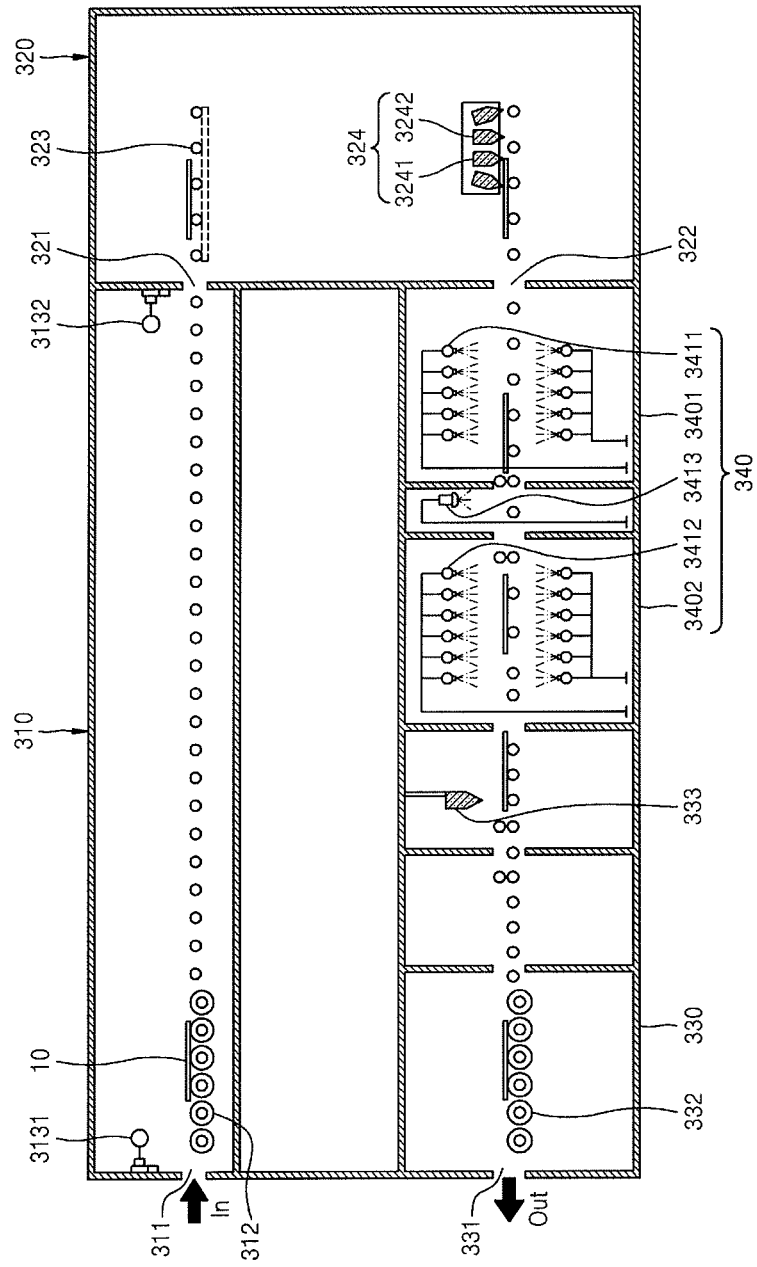
FIG. 3 is a schematic lateral cross-sectional view of an apparatus for cleaning a substrate according to another embodiment.

FIG. 3 is a schematic lateral cross-sectional view of an apparatus for cleaning a substrate according to another embodiment.

Referring to FIG. 3, the apparatus for cleaning a substrate may include a first chamber 310, a second chamber 320, a third chamber 330, and a fourth chamber 340.

The first chamber 310 includes a conveying member 312, which conveys a substrate 10 that is introduced through an inlet 311 to the first chamber 310 to the second chamber 320. The first chamber 310 may include a first ionizer 3131 and a second ionizer 3132. The first ionizer 3131 may be disposed adjacent to the inlet 311 in the first chamber 310, and the second ionizer 3132 may be disposed adjacent to an entering slot 321 to the second chamber 320. The first and second ionizers 3131 and 3132 may remove static electricity of the substrate 10.

The second chamber 320 may include the entering slot 321, an exit slot 322, an up-and-down moving member 323, and a spray member 324.

The substrate 10 conveyed from the first chamber 310 enters the second chamber 320 through the entering slot 321. The substrate 10 enters the third chamber 330 through the exit slot 322.

The up-and-down moving member 323 conveys the substrate 10 that has been conveyed from the first chamber 310 up and down in the second chamber 320. Referring to FIG. 3, the up-and-down moving member 323 is positioned at the entering slot 321 when the substrate 10 enters the second chamber 320 from the first chamber 310. When the substrate 10 is placed on the up-and-down moving member 323 after moving through the entering slot 321, the up-and-down moving member 323 descends to a level where the spray member 324 is positioned. After washing of the substrate 10 is completed and the substrate 10 is conveyed to the third chamber 330 through the exit slot 322, the up-and-down moving member 323 returns to the position adjacent to the entering slot 321.

The spray member 324 sprays liquid cleaning agents to remove an oxide film (not shown) on the substrate 10 and to wash the substrate 10. The spray member 324 may spray the liquid cleaning agents while moving above the substrate 10. Accordingly, the liquid cleaning agents may be substantially uniformly spread on the entire surface of the substrate 10, and thus, the occurrence of a stain due to the partial removal of the oxide film may be prevented.

The liquid cleaning agents may be first de-ionized water, a fluorine aqueous solution, second de-ionized water, and ozonated water. The spray member 324 may include a first nozzle 3241 that sprays the first de-ionized water and the fluorine aqueous solution, and a second nozzle 3242 that sprays the second de-ionized water and the ozonated water. The spray member 324 may also include four nozzles that respectively spray the first de-ionized water, the fluorine aqueous solution, the second de-ionized water, and the ozonated water.

The first nozzle 3241 rinses the substrate 10 by spraying the first de-ionized water on the substrate 10. Afterwards, the first nozzle 3241 removes the oxide film from the substrate 10 by spraying the fluorine aqueous solution on the substrate 10.

As described above, the first nozzle 3241 sprays the first de-ionized water and the fluorine aqueous solution. The first nozzle 3241 sprays the first de-ionized water for a period of time and, before the spray of the first de-ionized water is completed, sprays the fluorine aqueous solution. That is, the first de-ionized water and the fluorine aqueous solution are substantially simultaneously sprayed on the substrate 10 before the spray of the first de-ionized water is completed. This is because, if the fluorine aqueous solution is sprayed after the spray of the first de-ionized water is completed, due to the rapid concentration change of the fluorine aqueous solution, the oxide film may not be uniformly removed, and thus, may cause a stain on the substrate 10. However, as described above, in the current embodiment, the occurrence of a stain can be prevented by substantially simultaneously spraying the first de-ionized water and the fluorine aqueous solution for a predetermined period of time.

The second nozzle 3242 may sequentially spray the second de-ionized water and the ozonated water. The second nozzle 3242 may spray the second de-ionized water before the spray of the fluorine aqueous solution is completed. That is, the fluorine aqueous solution and the second de-ionized water may be substantially simultaneously sprayed on the substrate 10 for a predetermined period of time before the spray of the fluorine aqueous solution is completed. Also, the second nozzle 3242 may spray the ozonated water before the spray of the second de-ionized water is completed.

The second de-ionized water may wash away the fluorine aqueous solution remaining on the substrate 10. The ozonated water may form a silicon oxide film by reacting with a pure amorphous silicon layer that is exposed by the removal of a natural oxide film.

The substrate 10 that emerges from the second chamber 320 is conveyed to the outside of the apparatus for cleaning a substrate through the fourth chamber 340 and the third chamber 330. The fourth chamber 340 is located between the second chamber 320 and the third chamber 330.

The fourth chamber 340 may include a first rinse zone 3401 and a second rinse zone 3402. The first rinse zone 3401 rinses the substrate 10 that emerges from the second chamber 320 by spraying de-ionized water. The first rinse zone 3401 may include de-ionized water spray nozzles 3411 that spray de-ionized water. The second rinse zone 3402 rinses again the substrate 10 that emerges from the first rinse zone 3401 by spraying de-ionized water. The second rinse zone 3402 may include de-ionized water spray nozzles 3412. The apparatus for cleaning a substrate may further include a water jet 3413 between the first rinse zone 3401 and the second rinse zone 3402. The water jet 3413 sprays water on the substrate 10.

The third chamber 330 may include an air-knife 333 that blows a gas on the substrate 10 that is conveyed from the fourth chamber 340 and a track 332 that conveys the substrate 10. The air-knife 333 removes liquid remaining on the substrate 10 by spraying a gas such as nitrogen $N_2$. The substrate 10 is conveyed along the track 332 in the third chamber 330 and liquid remaining on the substrate 10 is removed by the air-knife 333. The substrate 10 is discharged to the outside through an outlet 331 of the third chamber 330.

Referring to FIG. 3, the third and fourth chambers 330 and 340 may be located below the first chamber 310. That is, the three chambers 310, 330 and 340 may configure a bi-layer structure.

In the apparatus for cleaning a substrate, according to at least one of the disclosed embodiments, as described above, chambers are configured in a multi-layered structure, thereby reducing the total size of the apparatus for cleaning a substrate. Also, the four chambers 310-340 may be configured in two to three closed systems, thereby reducing facility investment costs. Furthermore, a stain that may occur during removing a silicon oxide film can be prevented.

While the disclosed embodiments have been described with respect to the accompanying drawings, it will be understood by those of ordinary skill in the art that various changes in form and details may be made therein without departing from the spirit and scope of the following claims.

What is claimed is:

1. A method of manufacturing a flat panel display, the method comprising:
   receiving, at a first chamber, a substrate to be cleaned, wherein an oxide film is formed on the substrate;
   first transferring the substrate from the first chamber to a second chamber;
   removing, at the second chamber, the oxide film from the substrate;
   rinsing the substrate;
   second transferring the rinsed substrate to a third chamber; and
   discharging the substrate from the third chamber,
   wherein the first and third chambers are stacked,
   wherein the second chamber comprises:
   an inlet configured to receive the substrate conveyed from the first chamber;
   an outlet configured to transfer the substrate into the third chamber;
   an up-and-down moving member configured to move the substrate up and down in the second chamber; and
   a spray member configured to spray liquid cleaning agents on the substrate so as to remove the oxide film and to wash the substrate.

2. The method of claim 1, further comprising providing an ionizer adjacent to the inlet of the second chamber.

3. The method of claim 2, further comprising removing static electricity, via the ionizer, from the substrate before the substrate enters the second chamber.

4. The method of claim 1, wherein, when the first chamber is disposed on the third chamber, the up-and-down moving member moves the substrate that enters from the first chamber towards a lower direction in the second chamber, and wherein when the first chamber is located below the third chamber, the up-and-down moving member moves the substrate that enters from the first chamber towards an upper direction in the second chamber.

5. The method of claim 1, further comprising washing the substrate via a plurality of rear-side spray nozzles located below the up-and-down moving member, when the substrate is conveyed from the second chamber to the third chamber.

6. The method of claim 5, further comprising spraying, via the rear-side spray nozzles, de-ionized water on a lower surface of the substrate so as to wash the substrate.

7. The method of claim 1, further comprising spraying liquid cleaning agents on the substrate while the spray member moves above the substrate.

8. The method of claim 7, wherein the liquid cleaning agents comprise first de-ionized water, fluorine aqueous solution, second de-ionized water, and ozonated water.

9. The method of claim 8, wherein the spray member comprises i) a first nozzle configured to spray the first de-ionized water and the fluorine aqueous solution, and ii) a second nozzle configured to spray the second de-ionized water and the ozonated water.

10. The method of claim 1, wherein, when the spray member sprays a liquid cleaning agent, the up-and-down moving member tilts the substrate to a predetermined angle with respect to a horizontal direction.

11. The method of claim 10, wherein at least one of the liquid cleaning agents comprises first de-ionized water, fluorine aqueous solution, second de-ionized water, or ozonated water, and wherein the spray member comprises a single common nozzle configured to spray the liquid cleaning agent.

12. The method of claim 1, wherein the rinsing is performed at a fourth chamber that is located between the second and third chambers.

13. The method of claim 12, wherein the fourth chamber comprises:

a first rinse zone configured to spray de-ionized water so as to rinse the substrate that emerges from the second chamber; and
a second rinse zone configured to spray de-ionized water so as to rinse the substrate that emerges from the first rinse zone.

14. The method of claim 1, wherein the third chamber comprises an air-knife configured to blow a gas on the substrate.

15. The method of claim 1, further comprising moving the substrate, in the second chamber, upward or downward, wherein the moving is performed by the up-and-down moving member located inside the second chamber.

16. The method of claim 15, wherein the first chamber is located on the third chamber.

17. The method of claim 15, wherein the first chamber is located below the third chamber.

18. The method of claim 15, wherein the stacked first and third chambers are adjacent to the second chamber.

19. The method of claim 15, further comprising removing, at the first chamber, static electricity from the substrate.

20. The method of claim 15, wherein the first transferring is performed via a conveying member.

21. The method of claim 15, wherein the removing comprises spraying a fluorine aqueous solution on the substrate so as to remove the oxide film from the substrate.

22. The method of claim 21, wherein the removing further comprises spraying first de-ionized water before spraying the fluorine aqueous solution on the substrate, and spraying second de-ionized water after spraying the fluorine aqueous solution on the substrate.

23. The method of claim 22, wherein the removing further comprises sequentially spraying ozonated water and third de-ionized water on the substrate after spraying the second de-ionized water.

* * * * *